(12) United States Patent
Preuss (10) Patent No.: US 7,804,245 B2
(45) Date of Patent: Sep. 28, 2010

(54) ELECTROLUMINESCENT DEVICE HAVING IMPROVED BRIGHTNESS UNIFORMITY

(75) Inventor: Donald R. Preuss, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 264 days.

(21) Appl. No.: 12/018,846

(22) Filed: Jan. 24, 2008

(65) Prior Publication Data

US 2009/0189532 A1 Jul. 30, 2009

(51) Int. Cl.
*H01J 1/62* (2006.01)

(52) U.S. Cl. .................. 313/506; 313/498; 313/505

(58) Field of Classification Search ............. 315/169.3; 313/496–497, 501, 503–506, 517
See application file for complete search history.

(56) References Cited

U.S. PATENT DOCUMENTS

| | | | |
|---|---|---|---|
| 5,703,436 | A | 12/1997 | Forrest et al. |
| 5,834,893 | A | 11/1998 | Bulovic et al. |
| 5,955,837 | A | 9/1999 | Horikx et al. |
| 6,091,195 | A | 7/2000 | Forrest et al. |
| 6,107,734 | A | 8/2000 | Tanaka et al. |
| 6,274,980 | B1 | 8/2001 | Burrows et al. |
| 6,337,492 | B1 | 1/2002 | Jone et al. |
| 6,515,417 | B1 | 2/2003 | Duggal et al. |
| 6,693,296 | B1 | 2/2004 | Tyan |
| 6,717,358 | B1 | 4/2004 | Liao et al. |
| 6,777,871 | B2 | 8/2004 | Duggal et al. |
| 6,787,796 | B2 | 9/2004 | Do et al. |
| 6,800,999 | B1 | 10/2004 | Duggal et al. |
| 7,034,470 | B2 | 4/2006 | Cok et al. |
| 7,250,722 | B2* | 7/2007 | Cok et al. .............. 313/506 |
| 2001/0026124 | A1 | 10/2001 | Liu et al. |
| 2001/0033135 | A1* | 10/2001 | Duggal et al. ........... 313/506 |
| 2002/0121859 | A1* | 9/2002 | Hayashi et al. ......... 313/504 |
| 2003/0170491 | A1 | 9/2003 | Liao et al. |
| 2003/0189401 | A1 | 10/2003 | Kido et al. |
| 2004/0217702 | A1 | 11/2004 | Garner et al. |
| 2005/0018431 | A1 | 1/2005 | Shiang |

(Continued)

FOREIGN PATENT DOCUMENTS

EP 1 396 676 A2 3/2004

(Continued)

*Primary Examiner*—Douglas W Owens
*Assistant Examiner*—Tung X Le
(74) *Attorney, Agent, or Firm*—Morgan Lewis & Bockius LLP (57) ABSTRACT

An electroluminescent device having an opposing EL-segment pair, including a first EL-segment that produces light in response to a first through-device current having a first transparent electrode connection and a first reflective electrode connection; a second EL-segment that produces light in response to a second through-device current, and having a second transparent electrode connection and a second reflective electrode connection and being disposed adjacent to and spaced from the first EL-segment such that the first transparent electrode connection is on the opposite edge as the second transparent electrode connection and the direction of the first transparent electrode current is parallel but opposite to the direction of the second transparent electrode current; and the first and second EL-segments are connected to a common power source such that the two EL-segments can be simultaneously forward biased.

10 Claims, 9 Drawing Sheets

| U.S. PATENT DOCUMENTS | | | |
|---|---|---|---|
| 2006/0125410 A1 | 6/2006 | Duggal et al. | |
| 2008/0278067 A1* | 11/2008 | Tyan et al. | 313/504 |
| 2009/0135582 A1* | 5/2009 | Miller et al. | 362/84 |
| 2009/0184636 A1* | 7/2009 | Cok | 313/505 |

FOREIGN PATENT DOCUMENTS

| EP | 1 717 876 A1 | 11/2006 |
|---|---|---|
| JP | 2003-045676 | 2/2003 |
| WO | 02/37580 | 5/2002 |
| WO | 02/37568 | 5/2005 |

\* cited by examiner

ND DEVICE HAVING
ELECTROLUMINESCENT DEVICE HAVING IMPROVED BRIGHTNESS UNIFORMITY

FIELD OF THE INVENTION

The present invention relates to electroluminescent devices, and more particularly, to large area electroluminescent devices, and lighting panels made from the same, with improved brightness uniformity.

BACKGROUND OF THE INVENTION

The present invention relates to electroluminescent devices. Examples of electroluminescent devices include small molecule organic light emitting devices (SMOLED), polymer light emitting devices (PLED), and inorganic electroluminescent devices. The term "organic light emitting devices (OLED) refers to both small molecule organic light emitting devices and polymer light emitting devices.

A typical prior art electroluminescent device comprises a transparent substrate (which is 1 to 4 orders of magnitude thicker than the remaining layers), a transparent first electrode layer, a light-emitting element including at least one light-emitting layer, and a reflective second electrode layer. Light is generated in the electroluminescent device when electrons and holes that are injected from the two electrodes flow through the light-emitting element and generate light by either recombination or impact ionization. The light-emitting element can include several layers of materials including at least a light-emitting layer where the emitted light is generated. In the case of an OLED device, for example, the light-emitting element can include an electron injection layer, an electron transport layer, one or more light-emitting layers, a hole transport layer, and a hole injection layer. One or several of these layers can be combined and additional layers such as electron or hole blocking layers can be added. Most frequently, the first electrode layer is the anode and the second electrode layer is the cathode.

Furthermore, OLED structures called stacked OLED (or tandem OLED or cascaded OLED), are formed by stacking several individual OLEDs vertically. Forrest et al. in U.S. Pat. No. 5,703,436 and Burrows et al. in U.S. Pat. No. 6,274,980 disclosed their stacked OLEDs. In their disclosures, the stacked OLEDs are fabricated by vertically stacking several OLEDs, each independently emitting light of a different color or of the same color. However, each OLED unit in their devices needed a separate power source. In an alternative design, a stacked OLED structure, which is fabricated by stacking several individual OLEDs vertically and driven by only a single power source, was disclosed (see U.S. Pat. Nos. 6,337,492, 6,107,734, 6,717,358, U.S. Patent Application Publication Nos. 2003/0170491 A1, 2003/0189401 A1, and JP Patent Publication No. 2003045676A). In a stacked OLED having a number of N (N>1) EL units, the luminous efficiency can be N times as high as that of a conventional OLED containing only one EL unit (of course, the drive voltage can also be N times as high as that of the conventional OLED). Therefore, in one aspect to achieve long lifetime, the tandem OLED needs only about 1/N of the current density used in the conventional OLED to obtain the same luminance although the lifetime of the tandem OLED will be about N times that of the conventional OLED. In the other aspect to achieve high luminance, the tandem OLED needs only the same current density used in the conventional OLED to obtain a luminance N times as high as that of the conventional OLED while maintaining about the same lifetime. Each organic EL unit in a tandem OLED is capable of supporting hole and electron-transport, and electron-hole recombination to produce light. Each organic EL unit can comprise a plurality of layers including HTL (hole transport layer), ETL (electron transport layer), LEL (light emitting layer), HIL (hole injection layer), and EIL (electron injection layer). A light-emitting layer (LEL) can comprise one or more sub-layers each emitting a different color.

It is also common to employ one or more techniques for extracting light which is trapped in the high index OLED and substrate materials to the air. Various techniques have been suggested to increase the efficiency of the thin-film electroluminescent devices by reducing the light trapping effect and permit the substrate-mode and organic-mode of light to emit from the device. These techniques are described in the following references: U.S. Pat. Nos. 5,955,837, 5,834,893; 6,091,195; 6,787,796, 6,777,871; U.S. Patent Application Publication Nos. 2004/0217702 A1, 2005/0018431 A1, 2001/0026124 A1; WO 02/37580 A1, and WO02/37568 A1.

It is also known to connect a plurality of individual OLED devices in series and in parallel in order to form a 1 or 2 dimensional array of adjacent emitting devices. In U.S. Pat. No. 6,693,296, Tyan describes a structure in which adjacent OLED segments are connected in series on a single substrate. In U.S. Pat. No. 6,515,417, Duggal describes a method of mounting a plurality of individual OLED devices on a common substrate in order to form a larger area panel. The pairing of two OLED strips oriented in opposite directions, with the terminal anode of one strip connected to the terminal cathode of the second strip, and vice versa so that when driven by an AC signal, they will light alternately is disclosed by Cok in U.S. Pat. No. 7,034,470 and by Duggal in U.S. Pat. No. 6,800,999. In both of these references, the individual segments or devices are wired anode to cathode on each end, forming a rectifier such that the two strings will light alternately during the ac cycle.

A problem with all of the devices described thus far is that they provide uniform output only if the lateral extent of the individual devices is small. This is not significant in the case of small displays where the individual pixels are typically much less than 1 mm in extent. The problem becomes more noticeable for large displays, and for non-pixelated devices such as fixtures for general lighting and backlights for liquid crystal displays. If an electroluminescent segment is large, the current flowing through the transparent electrode will cause a significant voltage drop across that electrode which will, in turn cause a variation in the current density flowing through the device, resulting in a variation of the device brightness.

Figure 1:
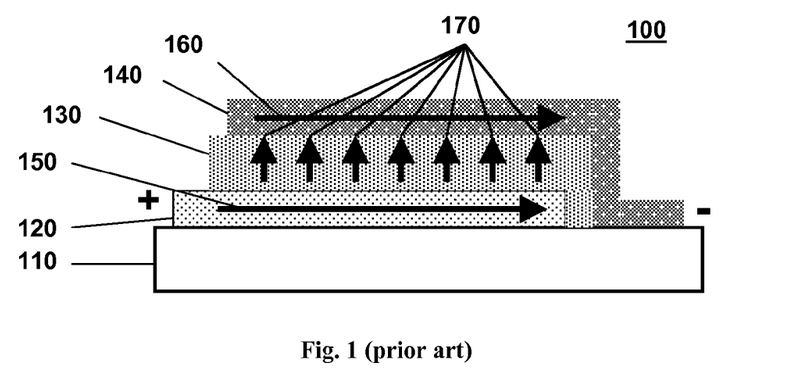
FIG. 1 is a cross section of a prior art EL-segment.

This problem is illustrated in FIG. 1, which depicts a prior art electroluminescent segment, referred to here as an EL-segment 100 configured as a bottom emitter. The device includes a transparent substrate 110, a transparent anode 120 such as ITO, a light emitting-element, 130, and a reflective cathode 140, such as Al or Ag arranged as shown in FIG. 1. When the left edge of the anode 120 is biased positive relative to the right edge of the cathode 140, an anode current 150 flows from left to right within the anode 120, and a cathode current 160 flows from left to right within the cathode 140. At each point along the device, a through device current 170 flows from the anode 120, through the electroluminescent layer, to the cathode 140, causing the generation of light. The local through device current density flowing through the electroluminescent layer depends on the voltage difference between the anode 120 and the cathode 140 at that point. However, the anode current 150 causes a voltage drop along the anode 120, which is much larger than the voltage drop along the more conductive cathode 140. As a result voltage across the electroluminescent layer is larger on the left side of the device shown in FIG. 1, than it is on the right side of the device. This results in the left side of the device being brighter than the right side of the device.

Figure 2:
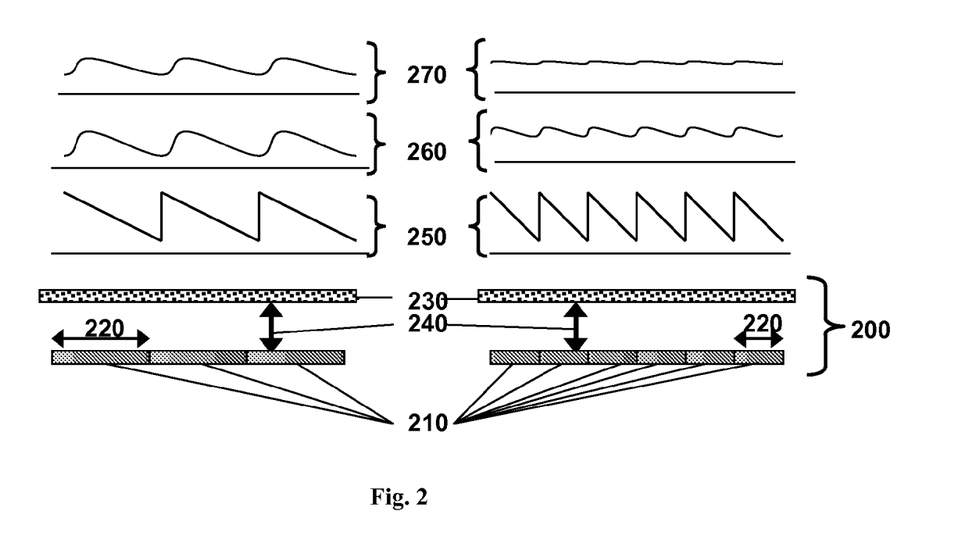
FIG. 2 shows light panels with a spaced diffuser to improve brightness uniformity.

This non-uniformity can detract from the appearance of a light panel for use in general lighting or as a backlight for LCD. In direct-lit LCD backlights (as opposed to edge-lit LCD backlights prevalent in small laptop displays), it is common to utilize diffusers spaced at some distance from the luminescent features in order to improve the uniformity of the backlight. For instructive purposes, this is illustrated in FIG. 2, which illustrates two different light panels 200. The light panel 200 on the left has large discrete lamps 210 which are non-uniform in brightness as indicated by the shading. The light panel 200 on the right has smaller discrete lamps 210, which are also non-uniform in brightness. Each lamp array can be characterized by a parameter, which will be referred to as the "brightness non-uniformity extent" (BNUE) 220. The BNUE 220 is the distance over which the non-uniformity in brightness extends, and is smaller for the light panel 200 on the right.

Transmissive diffuser 230 is positioned in front of the discrete lamps 210, separated from the plane of the discrete lamps 210 by a diffuser gap 240. Plots 250, 260 and 270 show the brightness at the diffuser as a function of position when the diffuser gap is close to zero, small, and larger respectively. As the diffuser gap 240 is increased, the light panel brightness becomes more uniform. More importantly, the brightness uniformity of the light panel 200 with the smaller BNUE 220 is better at any non-zero size of the diffuser gap 240. Two properties, which are of value in an LCD backlight as well as in a general lighting panel, are uniformity and thinness. These are both improved when the BNUE 220 of the discrete lamps 210 in a light panel 200 is smaller.

In a two dimensional panel, the BNUE 220 will likely be different in the two orthogonal directions in the plane. The uniformity of a light panel 200 with a spaced diffuser will track most closely with the smaller BNUE 220. Therefore, the BNUE 220 of a two dimensional light panel would be the smallest associated with any in-plane direction.

SUMMARY OF THE INVENTION

The present invention provides electroluminescent devices with improved brightness uniformity. In the present invention includes, an electroluminescent device having an opposing EL-segment pair, comprising:

(a) a first EL-segment that produces light in response to a first through-device current having a first transparent electrode connection and a first reflective electrode connection;

(b) a second EL-segment that produces light in response to a second through-device current, and having a second transparent electrode connection and a second reflective electrode connection and being disposed adjacent to and spaced from the first EL-segment such that the first transparent electrode connection is on the opposite edge as the second transparent electrode connection and the direction of the first transparent electrode current is parallel but opposite to the direction of the second transparent electrode current; and (c) the first and second EL-segments are connected to a common power source such that the two EL-segments can be simultaneously forward biased.

DETAILED DESCRIPTION OF THE INVENTION

The present invention is described below with respect to a normal bottom emitting device, in which the basic layer sequence is transparent substrate/transparent anode/light emitting layers/reflective cathode for which the light exits the device through the substrate. This invention can also be applied to top emitting devices with a basic layer sequence of substrate/reflective anode/light emitting layers/transparent cathode, or an inverted top emitting device with a basic layer sequence of substrate/reflective cathode/light emitting layers/transparent anode. For top emitting devices, the light escapes through the transparent electrode directly to the environment, or through a transparent protective cover glass, and need not pass through the substrate, eliminating the need for the substrate to be transparent.

Figure 3A:
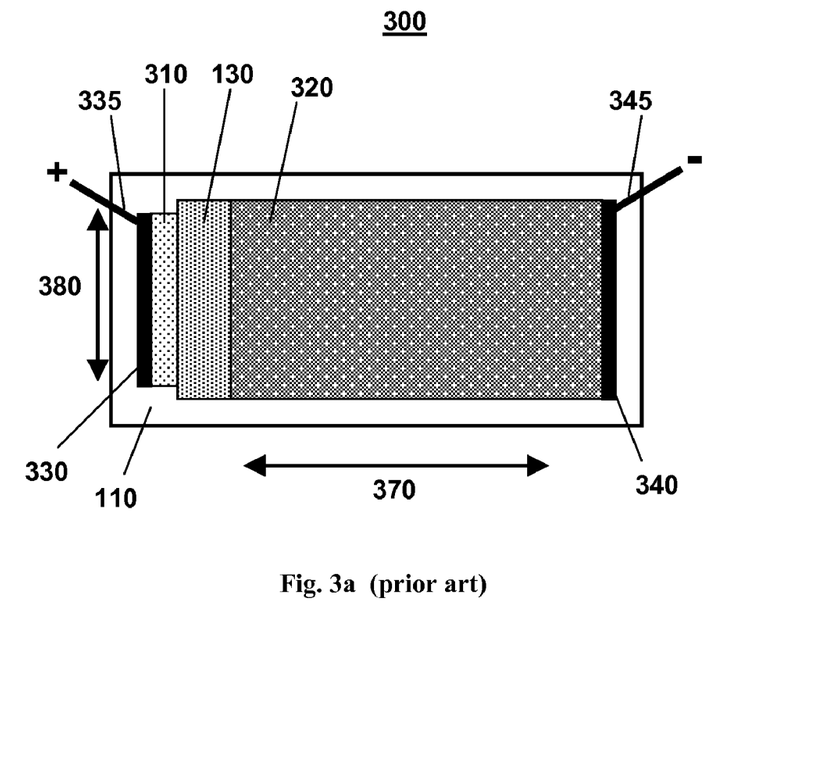
FIG. 3a and FIG. 3b are planar view and cross-section view respectively, of a prior art large EL-segment.
Figure 3B:
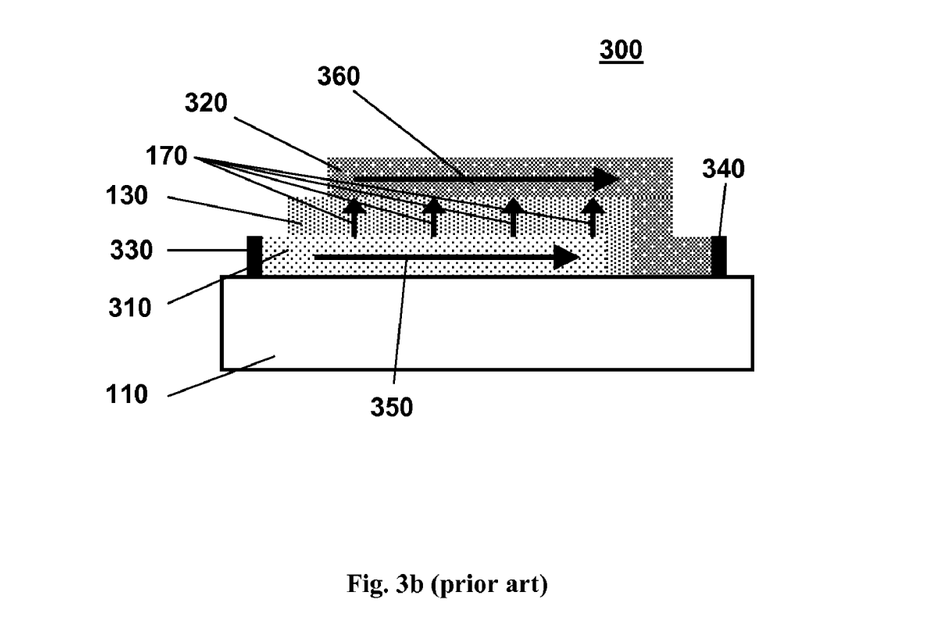

A prior art bottom-emitting electroluminescent device, referred to here as a large EL-segment 300, is illustrated in FIG. 3a and FIG. 3b, which show planar and cross sectional views respectively. The large EL-segment 300 is primarily different from the EL-segment 100 of FIG. 1, in that the area of the EL-segment is sufficiently large that through device current varies from point to point in the large EL-segment 300 causing the brightness of the segment to be non-uniform. This problem is not usually significant until the device dimension exceeds 1-2 mm. The scale of the EL-segment is important, because, unlike the pixels of a display, the large EL-segment 300 will require a larger drive current, and will experience a significant voltage drop in the poorly conducting transparent electrode, resulting in a non-uniformity of brightness over the emitting area. The following results and explanations will quantify this problem.

Referring to FIG. 3a and FIG. 3b, a transparent substrate 110 is coated in part with a transparent conductive oxide (TCO) or a very thin metal layer, which serves as a transparent electrode 310. A light-emitting element 130 is disposed on the transparent electrode 310. A reflective conductor, which can be a metal, is disposed on the light-emitting element, and serves as the reflective electrode 320. A transparent electrode connector 330 is provided at one end of the transparent electrode 310 for applying a bias voltage. A reflective electrode connector 340 is provided at the opposite end of the reflective electrode 320 for applying a bias voltage to the reflective electrode 320. A transparent electrode connection 335 and a reflective electrode connection 345 can then be formed between the transparent and reflective electrode connectors (330, 340) and an appropriate power supply such that, a transparent electrode current 350 will flow along the transparent electrode 310 and a reflective electrode current 360 will flow along the reflective electrode 320. If both electrode connectors 330 and 340 are good electrical conductors the voltage drop due to the current flowing within them will be negligible.

It is possible to form electrode connections 335 and 345 directly to the electrodes 330 and 320, but the current cannot be distributed uniformly across the width of the large EL-segment 300. Furthermore, it is not necessary for the reflective electrode connector 340 to be located on the opposite edge of the device from the transparent electrode connector 330 in order for the device to function, but subsequent discussion is simplified for the layout in FIG. 3, where the reflective and transparent electrode connectors (330, 340) are disposed on opposite edges of the large EL-segment 300.

The direction of the electrode currents is from left to right for the device depicted in FIG. 3, although the specific polarity indicating that the transparent electrode 300 is the anode is just the most common configuration. At each point where the transparent and reflective electrodes 310, 320 are separated by the light-emitting element 130, a through device current 170 will also flow vertically through the large EL-structure 300 from the anode to the cathode, causing the light-emitting element to emit light. A portion of the emitted light will escape from the large EL-segment 300 by traveling thorough transparent electrode 310, and transparent substrate 110. The light-emitting region of the large EL-segment 300 has a dimension in the direction of transparent electrode current 350, which will be referred to as the EL-segment length 370, and a dimension perpendicular to the direction of the transparent electrode current, which will be referred to as the EL-segment width 380.

Figure 4:
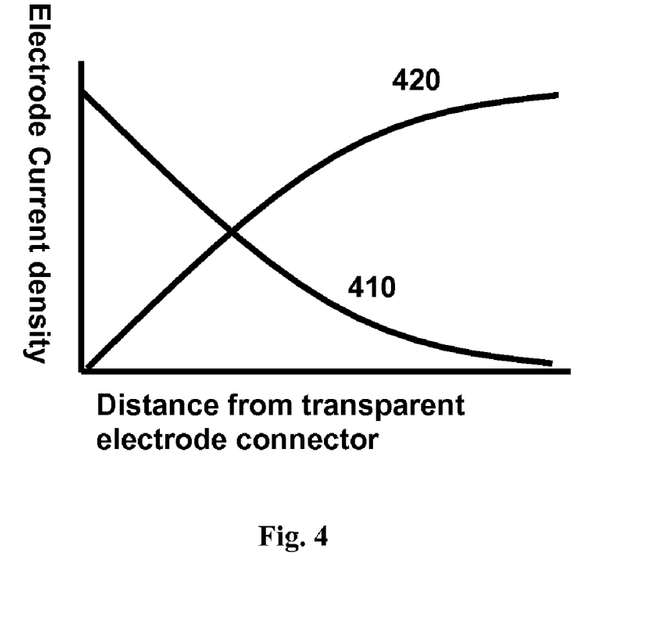
FIG. 4 shows schematically electrode current densities versus position in a large EL-segment.

The electrode currents of the large EL-segment 300 both flow from left to right as shown in FIG. 3a and FIG. 3b. If the layers in the large EL-segment 300 are uniform, and the electrode connectors (330, 340) are of negligible resistivity, then the current density in the electrodes will be constant at all points equidistant from the transparent electrode connector 330. FIG. 4 shows schematically, the variation of the electrode current densities as a function of distance from the transparent electrode connector 330. Near the transparent electrode connector 330, the reflective electrode current density 420 is nearly zero, and the transparent electrode current density 410 is at a maximum. As one moves away from the transparent electrode connector 330, the through-device current transfers the electrode current from the transparent electrode 310 to the reflective electrode 320. If the large EL-segment 300 is of constant width, the sum of the two electrode current densities will be a constant; equal to the large EL-segment device current, divided by the large EL-segment width.

Figure 5:
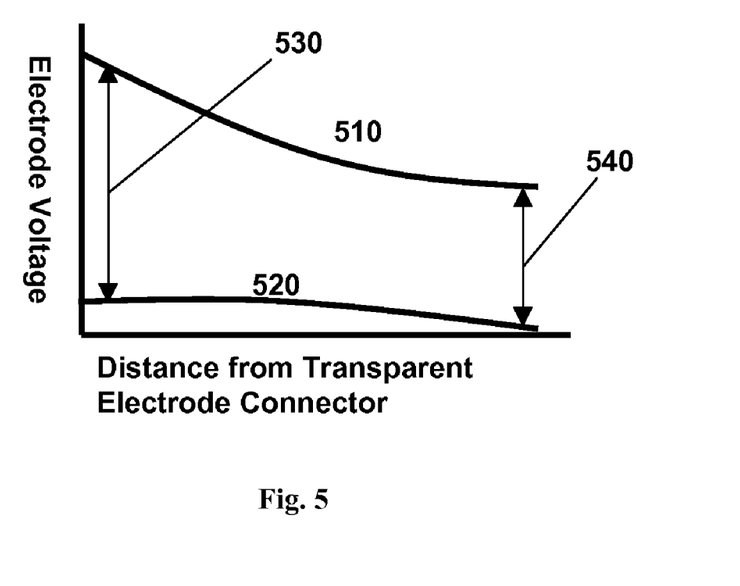
FIG. 5 shows schematically electrode voltages versus position in a prior art large EL-segment.

The electrode current density causes the electrode voltages to vary along the length of the large EL-segment 300. Since the transparent electrode 310, generally has a higher sheet resistivity than the reflective electrode 320, the voltage drop is more pronounced in the transparent electrode 310. This is shown schematically in FIG. 5, which shows transparent electrode voltage 510 and reflective electrode voltage 520 as a function of distance from the transparent electrode connector 320. Notice also that the transparent electrode voltage has a higher slope near the transparent electrode connector 330 where the transparent electrode current density 410 is largest, and the reflective electrode voltage has the highest slope near the reflective electrode connector 340 where the reflective electrode current density 420 is largest. As a result of these voltage drops in the electrodes, the voltage across light-emitting element 130 also varies with position along the large EL-segment length. Specifically, the large EL-segment voltage near transparent electrode connector 530 is greater than the large EL-segment voltage near reflective electrode connector 540.

Figure 6:
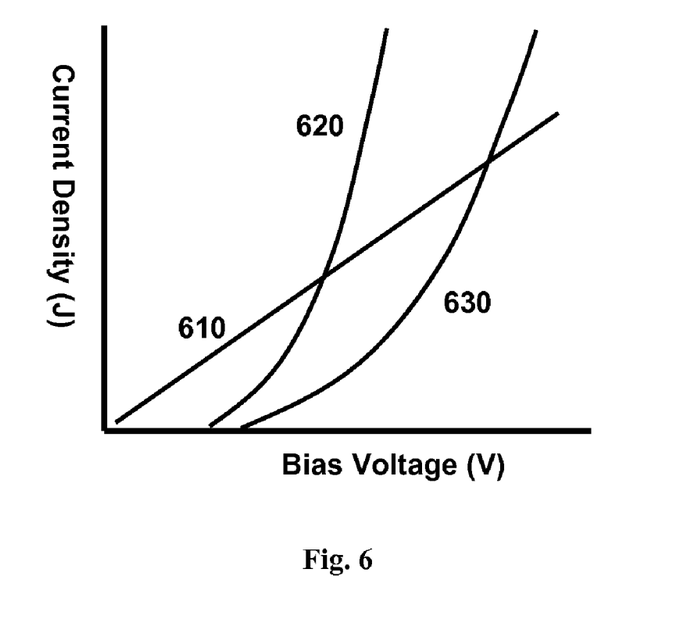
FIG. 6 shows schematically typical J-V curves for various classes of electrical devices.

The light-emitting element of an EL-segment is a diode junction for an OLED, PLED, or inorganic LED based device. The current, which flows through a forward biased diode junction, is a function of the applied voltage. In the case of an extended planar EL-segment, the through device current density (J) at any point in the device will be a function of the voltage (V) across the light-emitting element at that point. The J-V plots for three typical devices are shown schematically in FIG. 6. The J-V curve for an Ohmic device 610 is a straight line. The J-V curve for a perfect diode 620 is an exponential. The J-V curve for a real diode 630, will generally drop below the ideal diode curve due to the presence of Ohmic components, and other complicating factors such as charge injection layers, electron traps and hole traps. The J-V curve for the light-emitting element in the EL-segment will determine how the variation in voltage across the light emitting element, along the device results in a variation in current density along the device, and ultimately causes a variation of brightness along the device. The steeper the J-V curve, the greater the brightness variation will be for a particular voltage variation. As the technology for fabricating light-emitting layers improves, lower voltage devices, which behave more like a perfect diode 620, are being created. This causes the brightness variation for a large EL-segment to become more pronounced.

Since through device current non-uniformity is primarily due to the voltage drop in the transparent electrode, the magnitude of the effect will increase with the device length, and the device current. The quantitative behavior is complicated, but can be easily modeled for a uniform, rectangular device. Inputs to the model are the J-V curve, the anode sheet resistance, the cathode sheet resistance and the operating current per unit width (A/m). A reasonable, but not perfect assumption for many devices is that the luminance efficiency (cd/A) is independent of through-device current density (A/m$^2$). This permits one to relate the current non-uniformity at a particular device current density (A/m), to the brightness non-uniformity, for a specific device brightness (cd/m$^2$). The brightness of the large EL-segment will be uniform across the width, reducing the problem to a one-dimensional calculation to obtain brightness versus position along the large EL-segment length.

Figure 7:
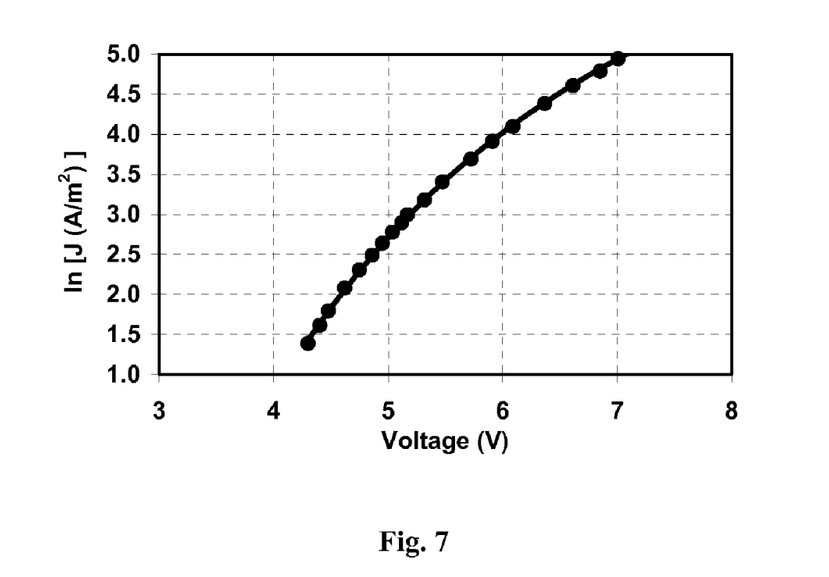
FIG. 7 is a plot of measured J-V curve of an actual small OLED device.

FIG. 7 is a plot of the J-V curve measured from a small fabricated OLED device. The device was small (3 mm/side) so there was a negligible voltage drop in the anode at the current densities shown. The shape of the curve is different from curve 630 in FIG. 6 because it is plotted on a log scale. A perfect diode would appear as a straight line on the log scale used in FIG. 7. Utilizing this J-V curve, and using typical values of 50 ohm/square for the anode sheet resistance, zero for the cathode sheet resistance, 20 cd/A for the luminance efficiency, and 2000 cd/m2 for the average large EL-segment luminance, the voltage and brightness along the length of a 2.5 cm long large EL-segment were computed, and are plotted in FIG. 8.

Figure 8:
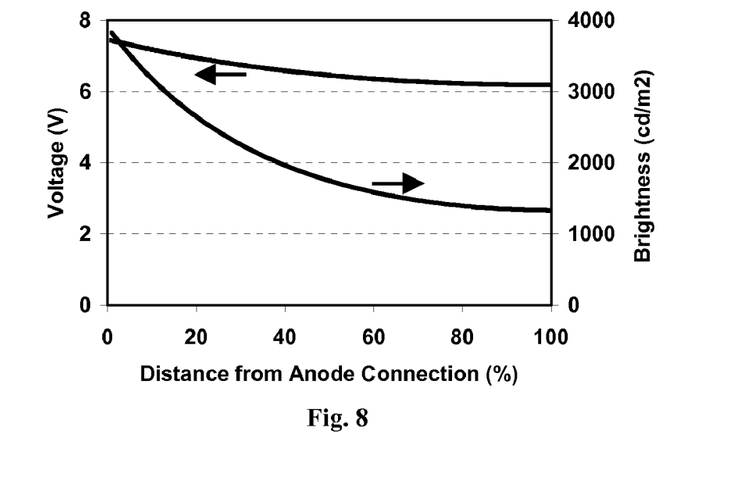
FIG. 8 is a plot of anode voltage, device brightness of a long EL-segment.

Referring to FIG. 8, the upper curve is the device voltage, which drops from 7.5 volts near the anode connection to about 6.2 volts near the cathode connection. Since the cathode was modeled as a perfect conductor, this drop is due entirely to the current density in the anode. However, due to the high slope of the J-V curve in the operating range, the brightness varies from 3800 cd/m$^2$ to 1300 cd/m$^2$. The term "brightness non-uniformity contrast" will be used to quantify the magnitude of the brightness variation of a device. For an EL-segment, it will be equal to $(B_{max}-B_{min})/(B_{max}+B_{min})$ where $B_{max}$ is the maximum brightness within the EL-segment, and $B_{min}$ is the minimum brightness within the EL-segment. In this case, the brightness non-uniformity contrast is equal to 49%. A uniform EL-segment would have a brightness non-uniformity contrast of 0%, and the worst case for an EL-segment would be a brightness non-uniformity contrast of 100%.

It is clear that the brightness non-uniformity contrast of a large EL-segment does not depend on the segment width at all, but only depends on the segment length. It is useful to define a long EL-segment as a large EL-segment, which is sufficiently long such that the brightness non-uniformity contrast is greater than 5% at the designed maximum current density, or the designed maximum brightness. Using the same model, which provided the data in FIG. 8, one can compute that the large EL-segment being modeled qualifies as a long EL-segment when the length exceeds 0.69 cm for an operational brightness of 2000 cd/m$^2$. At higher brightness, the length for "long" designation would be smaller than 0.69 cm.

In designing a lighting panel which uses long EL-segments, that is segments which suffer from a brightness non-uniformity contrast of at least 5% at the maximum designed operating current, then it is desirable to have the BNUE as small as possible, so that a transmissive diffuser can be located in close proximity to the emitter and still effectively smooth out the brightness non-uniformity.

Figure 9:
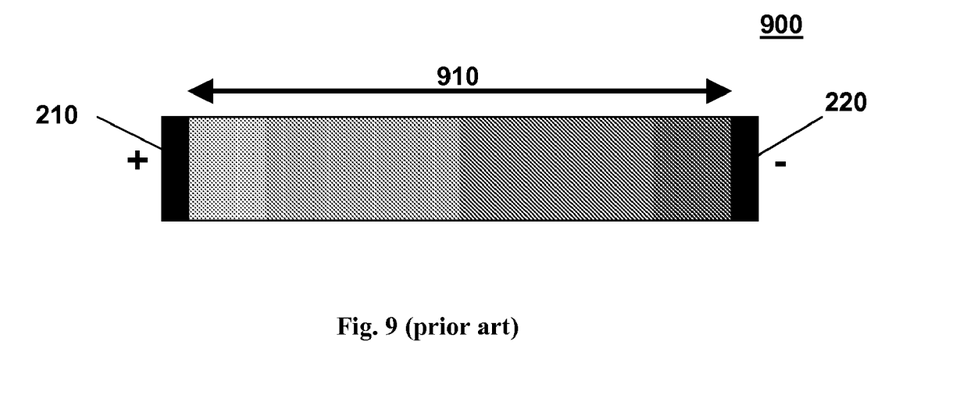
FIG. 9 is a schematic planar view of a narrow prior art EL-segment.
Figure 10:
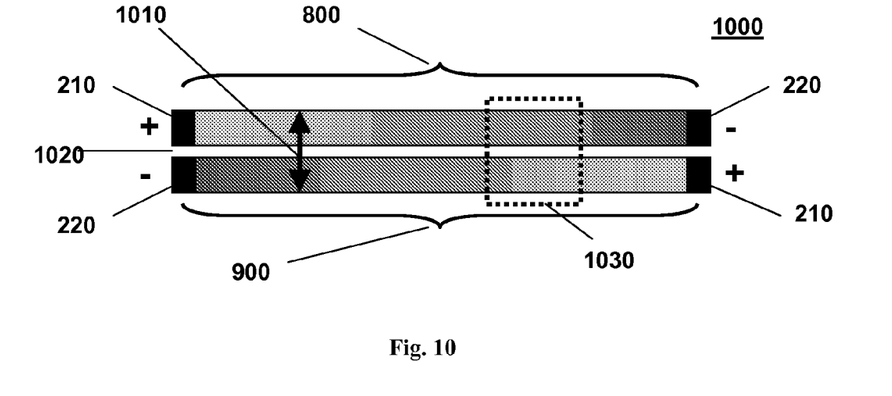
FIG. 10 is a schematic planar view of an opposing EL-segment pair.

The present invention provides an EL device with a smaller brightness non-uniformity extent (BNUE) than a comparable device of the prior art. This is accomplished in a first embodiment referred to here as an opposing EL-segment pair. Refer to FIG. 9 and FIG. 10. FIG. 9 shows a narrow EL-segment 900, which is a long EL-segment (>5% brightness non-uniformity contrast) with an EL-segment length, which is at least 2.5 times the EL-segment width, and preferably more than 5 times the EL-segment width. The shading of the lighted portion of the device indicates schematically, the relative brightness of the device (lighter is brighter). The BNUE 910 for the narrow EL-segment is equal to the EL-segment length. For convenience, FIG. 9 and all subsequent figures have been labeled with voltage polarity, which assumes that the transparent electrode is the anode.

FIG. 10 shows opposing EL-segment pair 1000, where two narrow EL-segments 900 are arranged on a single substrate adjacent to each other, separated by a narrow gap 1010. The width of the narrow gap 1010 is less than half of the narrow EL-segment width. A narrow gap width of less one fifth of the narrow EL-segment width would be preferred. The two narrow EL-segments 900 are situated such that when biased as shown, the transparent electrode currents flow in parallel but opposite directions. As a result of this arrangement, the brightest region of the first narrow EL-segment 900 is adjacent to the dimmest region of the second narrow EL-segment 900. As a result, a BNUE 1020 of the opposing EL-segment pair, spans only the width of the device, and not the length. Since the width is less than the length, the BNUE 1020 has been reduced.

The benefit of the opposing EL-segment pair can be better understood if one imagines that a diffuser is located a small distance away from the opposing EL-segment pair, which has the capability of averaging the light passing through a light diffusion area 1030 indicated by dashed square in FIG. 10. Due to the opposite brightness variation along the lengths of the two narrow EL-segments 900 forming the opposing EL-segment pair, the average amount of light passing through light diffusion area 1030 will be nearly constant along the length of the device. If the brightness curve in FIG. 8 were a straight line, the average brightness of the light diffusion area 1030 would be constant along the length of the device, but since the curve is not a straight line, it will be slightly higher at each end of the device than at the center. In this case, there is a small BNUC with a large brightness non-uniformity contrast in the direction of the device width, and a larger BNUC with a smaller brightness non-uniformity contrast in the direction of the device length. Nevertheless, a panel made from opposing EL-segment pairs would be more uniform than one made from otherwise identical narrow EL-segments.

As stated previously, the total emission of light at any particular distance from the anode connection is still not a constant. Even this variation could be further reduced by slightly decreasing the width of the two EL-segments at the ends relative to the width at the mid-points. Another method to mitigate the remaining variation would be to form each of the two EL-segments into a wedge, which is narrower near the ends with the anode connections, and wider at the opposite ends. In this manner, the total width of the opposing EL-segment pair could be kept constant, thereby simplifying panel design, and improving fill factor.

Figure 11:
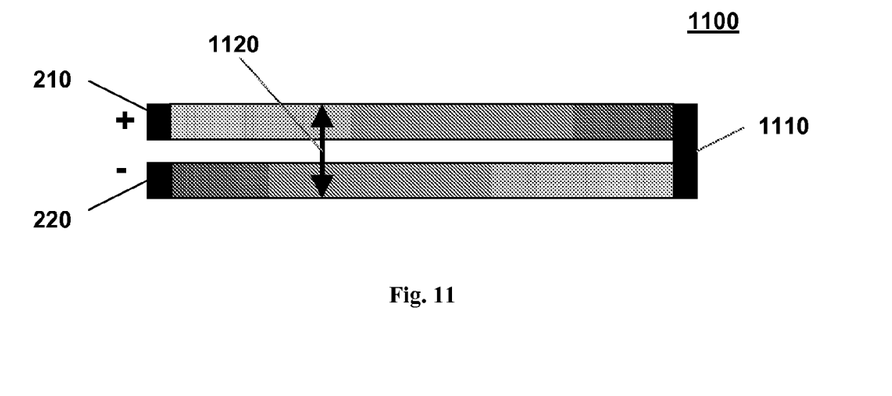
FIG. 11 is a schematic planar view of a folded EL-segment.

FIG. 11 shows a folded EL-segment 1100, which is a simple modification of the opposing EL-segment pair 1000. Anode-cathode series connector 1110 is used to serially connect the two opposing narrow EL-segments 900, which make up the folded EL-segment 1100. The folded EL-segment 1100 has an advantage over the opposing EL-segment pair 1000 in that the electrical connections are both on the same edge of the transparent substrate. The BNUE 1120 for the folded EL-segment 1110 is comparable to the BNUE 1020 for the opposing EL-segment pair 1000.

Figure 12:
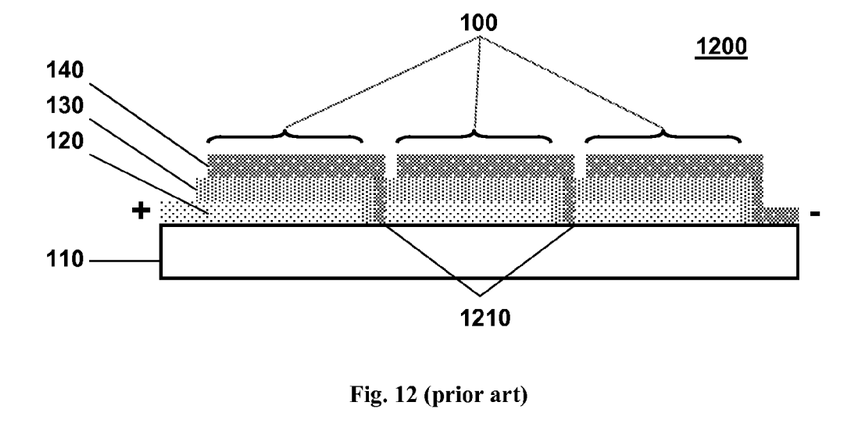
FIG. 12 is a schematic cross section of a prior art EL-strip.

It is also known in the prior art (U.S. Pat. No. 6,693,329) to attach a number of EL-segments together in series to form what will be referred to here as an EL-strip 1200, as is shown in FIG. 12. The series connection is formed, by permitting the cathode of one EL-segment to contact the anode of the next EL-segment. This connection will be referred to as EL-strip series connection 1210.

The use of EL-strips 1200 accomplishes a number of things in the fabrication of larger EL-panels for lighting and LCD backlighting applications. It permits the use of higher voltages and lower currents to be used to drive larger panels, which reduces loss of power through resistive heating. EL-strips 1200 also permit an EL-device to span a larger distance between electrical connections. It was shown earlier that a long EL-segment of only 2.5 cm in length, suffers from a significant brightness non-uniformity contrast. By forming an EL-strip from (for example) ten EL-segments, a distance of 25 cm might be spanned with no increase in brightness non-uniformity contrast, or a distance of 10 cm might be spanned with a significantly improved brightness non-uniformity contrast.

Figure 13:
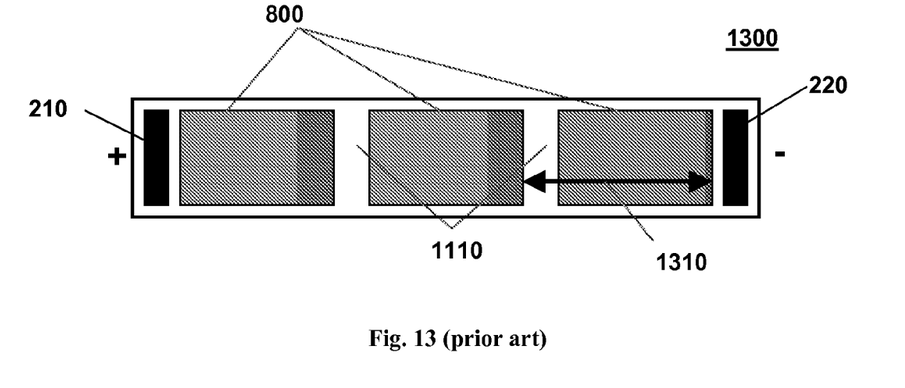
FIG. 13 is a schematic planar view of a prior art narrow EL-strip.

FIG. 13 shows the brightness non-uniformity contrast in a narrow EL-strip 1300, which is formed by serially connecting a number of narrow EL-segments 900. Each EL-strip series connection 1210 replaces the transparent electrode connector 230 and the reflective electrode connector 240 which would otherwise be located between each pair of narrow-EL-segments 900. Each of the narrow EL-segments 900, which form the narrow EL-strip 1300, have the same brightness non-uniformity as a stand alone narrow EL-segment. This is shown schematically, by the graded shading in FIG. 13. The BNUE of the narrow EL-strip 1300 is equal to the length of each narrow EL-segment 900 plus the gap resulting from the EL-strip series connection. Note that although the gap is shown in the figure as being white, there is actually no light emitted from this region.

Figure 14:
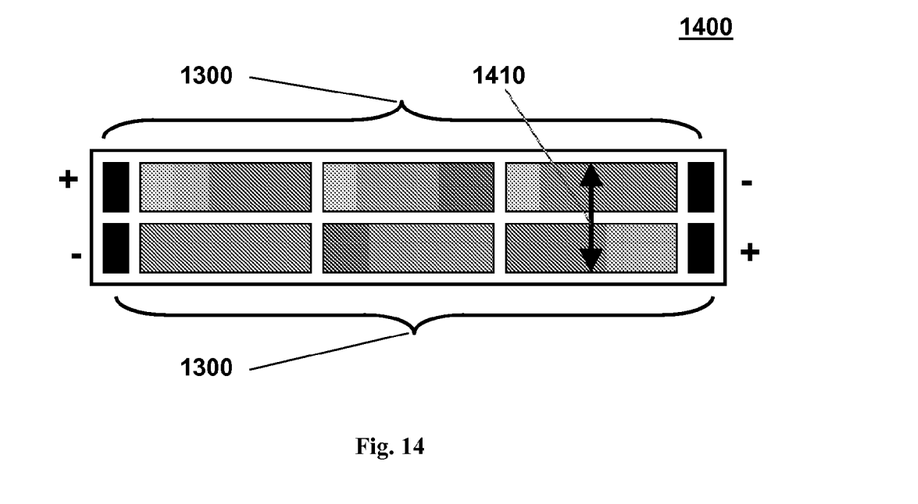
FIG. 14 is a schematic planar view of an opposing EL-strip pair.

In the same manner for which the opposing EL-segment pair 1000 and the folded EL-segment 1100 were shown to reduce the BNUE of a narrow EL-segment 900, it is also possible to reduce the BNUE of a narrow EL-strip 1300. FIG. 14 shows an opposing EL-strip pair 1400, which is formed by situating two narrow EL-strips 1300 adjacent to one another so that the directions of the transparent electrode current in each narrow EL-strip 1300 are parallel, but opposite. In this way, the BNUE 1410 is reduced from the length of each narrow EL-segment 1300, to the width of the opposing EL-strip pair, while retaining all of the advantages of an EL-strip 1200.

Figure 15:
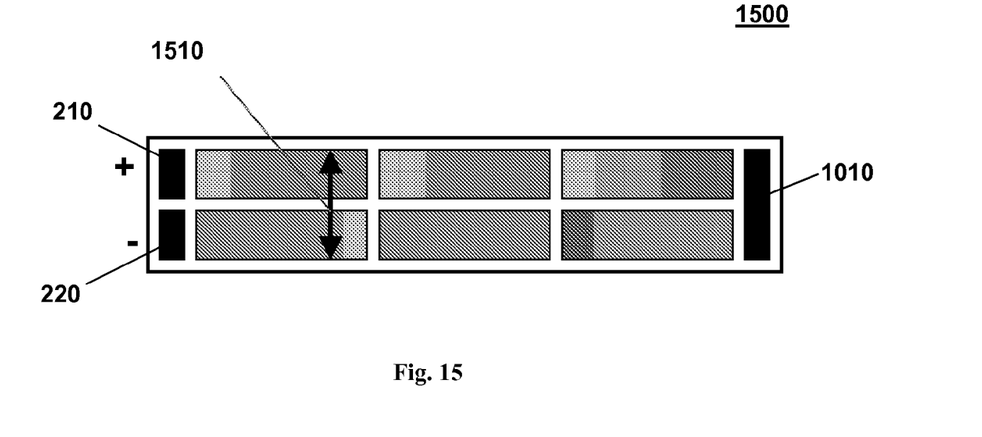
FIG. 15 is a schematic planar view of a folded EL-strip.

FIG. 15 shows a folded EL-strip 1500, which is a simple modification of the opposing EL-strip pair 1400. Anode-cathode series connector 1110 is used to serially connect the two narrow EL-strips 1300, which make up the folded EL-strip 1500. The folded EL-strip 1500 has an advantage over the opposing EL-strip pair in that the electrical connections are both on the same edge of the transparent substrate. The BNUE 1510 for the folded EL-strip 1500 is comparable to the BNUE 1410 for the opposing strip pair.

Figure 16:
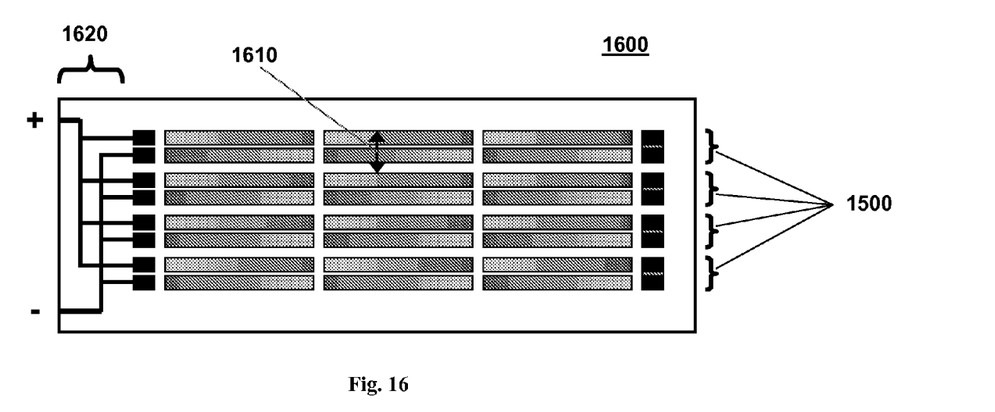
FIG. 16 is a schematic planar view of a low BNUE EL-zone.

In some advanced LCD backlights, in order to improve contrast, reduce power consumption, and reduce motion artifacts, methods referred to as "dynamic scanning" and "deep dynamic dimming", have been proposed. These methods require a backlight to be divided into discrete regions or zones, which can be individually controlled, each to a specific brightness, which would change with display content and frame timing. It is desirable to have a region of significant length and width, which can be operated at a single desired brightness, and have low BNUE. FIG. 16 shows a low BNUE EL-zone 1600 include an array of four folded EL-strips 1500. The BNUE 1610 for this EL-zone is generally equal to the width of the low BNUE EL-devices, which include the EL-zone. A parallel electrode network 1620 connects all anode connectors together, and connects all of the cathode connectors together so that the folded EL-strips 1500 can all be powered in concert by a single current or voltage driver.

Figure 17:
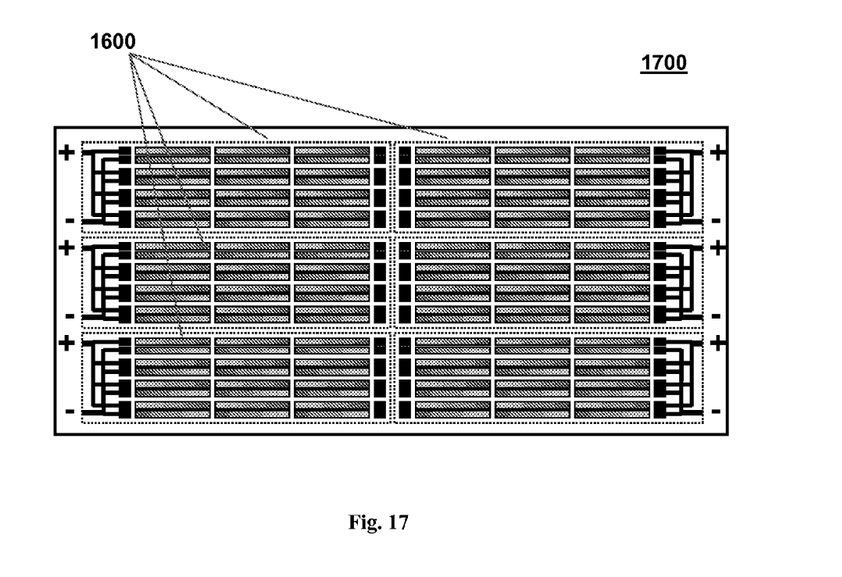
FIG. 17 is a schematic planar view of a low BNUE EL-panel.

In general, a low BNUE EL-zone can be formed, by arranging any number of low BNUE EL-devices adjacent to each other. Low BNUE EL-devices include opposing EL-segment pairs, folded EL-segments, opposing EL-strip pairs, and folded EL-strips. FIG. 17 shows a low BNUE EL-panel 1700, which includes six separate low BNUE EL-zones. Generally, a panel would be constructed on a single substrate, but it could also be fabricated on several smaller substrates, which are subsequently joined together to form a single device. A low BNUE EL-panel can include a single low BNUE EL-zone, as in a simple area light panel, or it can include a multitude of low BNUE EL-zones, as in a backlight for an LCD, for which, each low BNUE EL-zone is powered separately by a current or voltage driver.

The invention has been described in detail with particular reference to certain preferred embodiments thereof, but it will be understood that variations and modifications can be effected within the spirit and scope of the invention.

PARTS LIST

100 EL-segment
110 transparent substrate
120 transparent anode
130 light-emitting element
140 reflective cathode
150 anode current
160 cathode current
170 through device current
200 light panel
210 discrete lamp
220 brightness non-uniformity extent (BNUE)
230 transmissive diffuser
240 diffuser gap
250 brightness plot for zero gap
260 brightness plot for small gap
270 brightness plot for larger gap
300 large EL-segment
310 transparent electrode
320 reflective electrode
330 transparent electrode connector
335 transparent electrode connection
340 reflective electrode connector
345 reflective electrode connection
350 transparent electrode current
360 reflective electrode current
370 EL-segment length
380 EL-segment width
410 transparent electrode current density
420 reflective electrode current density
510 transparent electrode voltage
520 reflective electrode voltage
530 EL-segment voltage near transparent electrode connector
540 EL-segment voltage near reflective electrode connector
610 J-V curve for an Ohmic device
620 J-V curve for a perfect diode
630 J-V curve for a real diode
900 narrow EL-segment
910 BNUE
1000 opposing EL-segment pair
1010 narrow gap
1020 BNUE
1030 light diffusion area
1100 folded EL-segment
1110 anode-cathode series connector
1120 BNUE
1200 EL-strip (prior art)
1210 EL-strip series connection
1300 narrow EL-strip
1310 NUE for a narrow EL-strip
1400 opposing EL-strip pair
1410 BNUE
1500 folded EL-strip
1510 BNUE
1600 low BNUE EL-zone
1610 BNUE
1620 parallel electrode network
1700 low BNUE EL-panel

The invention claimed is:

1. An electroluminescent device having an opposing EL-segment pair, comprising:

(a) a first EL-segment that produces light in response to a first through-device current having a first transparent electrode connection and a first reflective electrode connection;

(b) a second EL-segment that produces light in response to a second through-device current, and having a second transparent electrode connection and a second reflective electrode connection and being disposed adjacent to and spaced from the first EL-segment such that the first transparent electrode connection is on the opposite edge as the second transparent electrode connection and the direction of the first transparent electrode current is parallel but opposite to the direction of the second transparent electrode current; and (c) the first and second EL-segments are connected to a common power source such that the two EL-segments can be simultaneously forward biased.

2. The electroluminescent device of claim 1 where the first and second transparent electrode connections are electrically common and the first and second reflective electrode connections are electrically common.

3. The electroluminescent device of claim 2, wherein the first and second EL-segments are long EL-segments, which have a brightness non-uniformity contrast of more than 5% at the maximum designed device current.

4. The electroluminescent device of claim 3 wherein the first and second EL-segments are narrow EL-segments which each have an EL-segment length that at least 2.5 times the EL-segment width.

5. The electroluminescent device of claim 1, wherein the first reflective electrode connection is adjacent to the second transparent electrode connection, and the first reflective electrode connection is electrically connected to second transparent electrode connection by an anode-cathode series connector to form a folded EL-segment.

6. An electroluminescent device having an opposing EL-strip pair, comprising: (a) a first EL-strip having two or more EL-segments connected in series that produces light in response to a through-device current, having a first transparent electrode connection and a first reflective electrode connection; (b) a second EL-strip having two or more EL-segments connected in series that produces light in response to a second through-device current, having a second transparent electrode connection and a second reflective electrode connection and being disposed adjacent to and spaced from the first EL-strip such that the second transparent electrode connection is at the opposite end from the first transparent electrode connection and the direction of the transparent electrode currents in each EL-segment of the first EL-strip are parallel but opposite to the direction of the transparent electrode currents in each EL-segment of the second EL-strip; and (c) the first and second EL-strips are connected to a common power supply such that the two EL-strips are simultaneously forward biased.

7. The electroluminescent device of claim 6 where the first and second transparent electrode connections are electrically common and the first and second reflective electrode connections are electrically common.

8. The electroluminescent device of claim 7, wherein the EL-segments are long EL-segments, each having a brightness non-uniformity contrast of more than 5% at the maximum designed device current.

9. The electroluminescent device of claim 8, wherein the EL-segments are narrow EL-segments each having a length that at least 2.5 times the segment width.

10. The electroluminescent device of claim 6, wherein the first reflective electrode connection is adjacent to the second transparent electrode connection, and the first reflective electrode connection is electrically connected to second transparent electrode connection by an anode-cathode series connector to form a folded EL-segment.

* * * * *